(12) United States Patent
Norman et al.

(10) Patent No.: US 6,869,876 B2
(45) Date of Patent: Mar. 22, 2005

(54) PROCESS FOR ATOMIC LAYER DEPOSITION OF METAL FILMS

(75) Inventors: John Anthony Thomas Norman, Encinitas, CA (US); David Allen Roberts, Fogelsville, PA (US); Melanie Anne Boze, Encinitas, CA (US)

(73) Assignee: Air Products and Chemicals, Inc., Allentown, PA (US)

( * ) Notice: Subject to any disclaimer, the term of this patent is extended or adjusted under 35 U.S.C. 154(b) by 0 days.

(21) Appl. No.: 10/324,781

(22) Filed: Dec. 20, 2002

(65) Prior Publication Data

US 2004/0087143 A1 May 6, 2004

Related U.S. Application Data

(63) Continuation-in-part of application No. 10/287,903, filed on Nov. 5, 2002, now abandoned.

(51) Int. Cl.$^7$ .............................................. H01L 21/44
(52) U.S. Cl. ........................ 438/680; 438/685; 438/686; 438/687
(58) Field of Search .......................... 438/680, 685–687

(56) References Cited

U.S. PATENT DOCUMENTS

| | | | |
|---|---|---|---|
| 5,306,666 A | | 4/1994 | Izumi |
| 6,368,954 B1 | | 4/2002 | Lopatin et al. ............. 438/627 |
| 6,475,276 B1 | * | 11/2002 | Elers et al. ................. 438/680 |
| 2001/0054769 A1 | | 12/2001 | Raaijmakers et al. ....... 257/758 |
| 2002/0004293 A1 | | 1/2002 | Soininen et al. ............ 438/584 |
| 2002/0106846 A1 | | 8/2002 | Seutter et al. .............. 438/200 |
| 2002/0117399 A1 | | 8/2002 | Chen et al. ................. 205/125 |

FOREIGN PATENT DOCUMENTS

WO     WO 01/66832 A2     9/2001

OTHER PUBLICATIONS

Higashi, et al., "Sequential Surface Chemical Reaction Limited Growth of High Quality $Al_2O_3$ Dielectrics," *Applied Physics Letter*, vol. 55, No. 19 (1989), pp. 1963–1965.

S. M. George, et al., "3d Internal Symposium on Atomic Layer Epitaxy and Related Surface Processes," *Applied Surface Science*, 82/83 (1994) pp. 460–467.

Per Martensson, et al., "Atomic Layer Epitaxy of Copper," *J. Electrochem. Soc.*, vol. 145, No. 8, Aug. 1998, pp. 2926–2931.

Raj Solanki, et al., "Atomic Layer Deposition of Copper Seed Layers," *Electrochemical and Solid–State Letters*, Vo. 3 (10) (2000), pp. 497–480.

Per Martensson, et al., "Atomic Layer Epitaxy of Copper on Tantalum," *Chem. Vap. Deposition*, vol. 3, No. 1 (1997), pp. 45–50.

Park, et al., "Plasma–Enhanced Atomic Layer Deposition of Tantalum Nitrides Using Hydrogen Radicals as a Reducing Agent," *Electrochemical and Solid–State Letters*, pp. C17–C19, 2001.

P. Martensson, et al., Atomic Layer Expitaxy of Copper on Tantlalum, Chem. Vap. Deposition (1997), 3, No. 1, pp. 45–50.

European Search Report No. 03025374.4–2119 dated Apr. 23, 2004.

* cited by examiner

*Primary Examiner*—Lynne A. Gurley
(74) *Attorney, Agent, or Firm*—Rosaleen P. Morris-Oskanian (57) ABSTRACT

In the present invention, a metal halide film is grown which is then reduced to the metal film rather than growing the metal film directly on the substrate surface. In certain embodiments, a metal halide film is grown from at least two precursors: a halogen-containing precursor and a metal-containing precursor. The metal halide film is then exposed to a reducing agent to form the metal film. In certain preferred embodiments, the metal halide film is exposed to the reducing agent prior to the completion of the growing step.

30 Claims, 2 Drawing Sheets

PROCESS FOR ATOMIC LAYER DEPOSITION OF METAL FILMS

CROSS-REFERENCE TO RELATED APPLICATIONS

This application is a continuation-in-part of U.S. patent application Ser. No. 10/287,903, filed 5 Nov. 2002, now abandoned, the disclosure of which is incorporated by reference herein in its entirety.

FIELD OF THE INVENTION

The present invention relates generally to a method for forming metal layers on semiconductor substrates. More specifically, the present invention relates to a method for forming seed layers, preferably copper and copper containing films, via atomic layer deposition and substrates comprising same.

BACKGROUND OF THE INVENTION

In the semiconductor industry, copper interconnects are increasingly being used as an interconnect material rather than aluminum. The superior electrical conductivity of copper over aluminum may result in higher speed interconnections of greater current carrying capability. Currently, copper interconnects are formed using a so-called "damascene" or "dual-damascene" fabrication process. Briefly, a damascene metallization process forms interconnects by the deposition of conducting metals in recesses formed on a semiconductor wafer surface. Typically, semiconductor devices (e.g., integrated circuits) are formed on a semiconductor substrate. These substrates are generally covered with an oxide layer. Material may be removed from selected regions of the oxide layer creating openings referred to as in-laid regions within the substrate surface. These in-laid regions correspond to a circuit interconnect pattern forming the conductor wiring of the device.

Once the in-laid pattern has been formed within the oxide layer, a thin barrier layer may be fabricated that evenly blankets the patterned oxide layer. This barrier layer may composed of, but is not limited to, titanium nitride, tantalum nitride, or tungsten nitride. After the barrier layer is formed, a seed layer of a conductive metal, preferably comprising copper, is deposited. The seed layer of conductive metal or copper forms the foundation for the bulk deposition of copper by a variety of deposition techniques including, but not limited to, physical sputtering, chemical vapor deposition (CVD) or electroplating. After the bulk copper has been deposited, excess copper may be removed using, for example, by chemical-mechanical polishing (CMP). The surface is then cleaned and sealed with a sealing layer. Further processing may then be performed.

An ongoing difficulty in the manufacture of semiconductor devices is the increasing miniaturization of the devices. In some devices, the smallest lines and in-laid regions may be less than 0.2 microns wide and over 1 micron deep yet it is becoming increasingly critical that the seed layer be continuous, smooth, and conformal along the sidewalls and bottom of these in-laid regions. Thus, there is a growing need for processes capable of growing extremely thin and highly conformal metal films or seed layers inside these microscopic lines and in-laid regions without leaving any voids that could lead to electrical failures in the finished product. One particularly attractive technique for growing such ultra conformal metal films is Atomic Layer Deposition ("ALD"). It is envisioned that this technique may be particularly useful in the formation of barrier and/or seed layers in semiconductor devices having high aspect ratios, i.e., deep trenches having narrow trench widths. This technique has been particularly useful for forming thin, conformal layers of a variety of formulations such as titanium nitride, aluminum oxide, and copper.

In a typical ALD process, one or more reagents, referred to herein as precursors, are chemisorbed onto a substrate surface to form a monolayer of precursor that is approximately one molecule thick. A second reagent may be introduced to chemically react with the first chemisorbed layer to grow the desired film on the substrate surface. The first reagent can then be reintroduced and the cycle repeated. Reagents or precursors that are best suited for an ALD process are readily volatile, have high chemical reactivity, form readily volatile by-products, and, at the molecular level, are dense in the element to be deposited (reacted) onto the substrate surface. After sufficient process cycles of monolayer formation has occurred, the process can be terminated to yield the final film. Alternatively, the film may be created by reacting the monolayers by thermal processing or by chemical reduction via a reducing agent.

The references, Higashi et al., "Sequential Surface Chemical Reaction Limited Growth of High Quality $Al_2O_3$ Dielectrics" *Applied Physics Letter*, Vol 55, No. 19 (1989), pp. 1963–65 and S. M. George, et al., $3^{rd}$ Internal Symposium on Atomic Layer Epitaxy and Related Surface Processes, describe ALD processes for the growth of aluminum oxide from trimethylaluminum and water vapor reagents. In this process, it is believed that the trimethylaluminum vapor may react strongly with a surface monolayer of hydroxyl groups resulting from a prior exposure to water vapor. In the ensuing reaction, it is believed that aluminum-oxygen bonds are formed and methane gas is released as a result of the methyl groups within the trimethylaluminum reagent abstracting hydrogen from the hydroxyl groups on the surface. Residual methyl groups on the aluminum atoms are perceived to be bonded to the surface by the oxygen present are then reacted away to provide additional methane and surface Al—OH groups when a subsequent pulse of water vapor is introduced. These surface Al—OH groups may be reacted with additional trimethylaluminum to provide further Al—OH groups. Thus, a network of aluminum oxide is grown as these alternating cycles of trimethylaluminum and water vapor pulses are repeated. Excess reagent is readily purged away from the surface after each pulse because there are only a finite number of surface reactive sites available to form bonds. Consequently, monolayer coverage of the surface may be readily achieved.

The semiconductor fabrication industry has employed a variety of ALD processes for growing copper or copper containing films, either on diffusion barrier and/or adhesion promotion materials or directly upon semiconductor materials, using a variety of different copper precursors and reducing agents. For example, the reference, Per Martensson, et al., "Atomic Layer Epitaxy of Copper", *J. Electrochem. Soc.*, Vol. 145, No. 8, August 1998, pp. 2926–31 ("Per Martensson I"), describes an ALD process for growing copper films using hydrogen gas as the reducing agent to reduce the adsorbed monolayers of the copper β-diketonates, Cu(II)-bis(2,2,6,6-tetramethyl-3-5-heptadionate) ("$Cu^{+2}$(thd)"). The $Cu^{+2}$(thd) copper precursor, however, is a relatively large and bulky molecule. Because of this, the amount of copper in an adsorbed monolayer of $Cu^{+2}$(thd) copper is relatively low. Hence, more process cycles may need to be performed to have sufficient deposition of copper.

The reference, Raj Solanki, et al., "Atomic Layer Deposition of Copper Seed Layers", *Electrochemical and Solid-State Letters*, Vol. 3 (10) (2000), pp. 497–480 ("Raj Solanki"), describes an ALD process for growing copper films using ethanol, methanol or formalin, as the reducing agents to reduce the adsorbed monolayers of the copper bis(β-diketonate), Cu(II) bis(1,1,1,5,5,5-hexafluoroacetylacetonate hydrate) ("$Cu_{+2}(hfac)_2$"). One challenge with this approach is that the copper precursor used may be unstable with respect to its loss of water of hydration. This could lead to problems of inconsistency in delivering the precursor to the substrate surface.

The references, Per Martensson, et al., "Atomic Layer Epitaxy of Copper on Tantalum", *Chem. Vap. Deposition*, Vol. 3, No. 1 (1997), pp. 45–50 ("Per Martensson II") and published U.S. Pat. Application No. 2002/0106846, describe ALD processes for growing copper seed layers using copper (+1) chloride as the copper source and hydrogen gas or triethyl boron (TEB), respectively, as the reducing agents to reduce adsorbed monolayers of copper chloride. Copper chloride may present difficulties in vapor delivery due to its relatively low volatility and high melting point (430°).

Published U.S. Patent Application US 2002/0004293 A1 describes an ALD process for growing a copper oxide film. The copper oxide film is grown in an ALD process by alternating the $Cu^{+2}(thd)$ copper precursor with ozone. The copper oxide layer can then be reduced using a variety of reagents. Like Per Martensson I, this method may suffer from using the bulky $Cu^{+2}(thd)$ copper precursor. Further, the ozone precursor is a harsh oxidizing agent potentially capable of irreversibly damaging the substrate by oxidizing the underlying barrier layer.

In addition to the problems cited above, these prior art methods for forming copper ALD films also suffer from relatively weak absorption between the copper precursor and underlying substrate. Unlike the ALD process for growing aluminum oxide layers wherein the aluminum from the trimethyaluminum precursor forms a strong bond with oxygen because of the hydroxyl groups on the substrate surface, the prior art ALD processes for growing copper layers may have relatively weaker chemisorption of the copper precursor onto the substrate surface because the metal or metal oxide substrate surface lacks strongly coordinating sites or chemical reactivity to bond the precursor to the surface. While not wishing to be bound by theory, weaker absorption can result in intermittent and patchy coverage in that some areas of the substrate may have incomplete coverage while other areas may have more than one monolayer of coverage ultimately resulting in an uneven and rough copper film. Because there is no strong chemical bond or relative attraction between the underlying surface and the copper precursor, achieving uniform monolayer coverage prior to reduction of the copper precursor presents more of a challenge. Subsequently, the pressure of the reactor, the flow of the precursor, the choice of carrier gas, etc., may have to be carefully controlled in order to achieve uniform monolayer coverage. As a result, the processing window for these parameters becomes narrower and the possibility of reduced process yield and diminished throughput increases.

Accordingly, there is a need in the art to provide a method, particularly an ALD-based method for forming a thin metal film, such as a copper or copper containing film film, onto the surface of a substrate which results in chemisorbed layers having excellent conformality. There is an additional need to provide a metal, particularly a copper or copper containing, film with improved adhesion to the underlying substrate material or underlying diffusion barrier and/or adhesion promotion material.

All references disclosed herein are incorporated by reference in its entirety.

BRIEF SUMMARY OF THE INVENTION

The present invention satisfies one, if not all, of the needs in the art by providing a method for forming a metal layer on at least a portion of the surface of a substrate. Specifically, in one aspect of the present invention, there is provided a method of depositing a metal layer on a semiconductor substrate comprising: growing a metal halide layer from a halogen-containing precursor and a metal-containing precursor on at a least a portion of the surface and exposing the metal halide layer to a reducing agent to provide the metal layer.

In a further aspect of the present invention, there is provided a method of depositing a metal layer on a surface of a substrate comprising: growing a metal halide layer on the surface by contacting the surface with a halogen-containing precursor and a metal-containing precursor wherein the halogen and the metal within the precursors react to form the metal halide layer; and exposing the metal halide layer to a reducing agent to provide the metal layer.

In yet another aspect of the present invention, there is provided a method of depositing a metal layer on a semiconductor substrate surface comprising: growing a metal halide layer from a halogen-containing precursor comprising an acidic compound and a metal-containing precursor on at a least a portion of the surface wherein the semiconductor substrate has a barrier material to which the metal halide layer is grown thereupon; and exposing the metal halide layer to a reducing agent to provide the metal layer.

These and other aspects of the present invention will be more apparent from the following description.

DETAILED DESCRIPTION OF THE INVENTION

The present invention of this disclosure provides an improved process whereby a seed layer, preferably a copper or copper containing film, is prepared by growing a metal halide layer from at least one metal-containing precursors and at least one halogen-containing precursors. In preferred embodiments of the present invention, the metal halide layer is grown in an ALD process. In these embodiments, the metal and halogen elements within the precursors react to form the metal halide layer. Either prior to or after the metal halide layer has reached a suitable thickness, the metal film is exposed to a reducing agent to provide the metal layer. The process of the present invention differs from prior art ALD processes in which the copper film is formed from a copper halogen precursor. In the prior art processes, a copper halide is used as a volatile precursor whereas in the present invention, the copper halide is grown and then reduced to provide the copper or copper-containing film. Unlike these prior art processes, the process of the present invention may provide better adhesion due to the stronger chemisorption resulting from the interaction of the metal and the halogen atoms with respect to each other and the underlying substrate surface.

Figure 1:
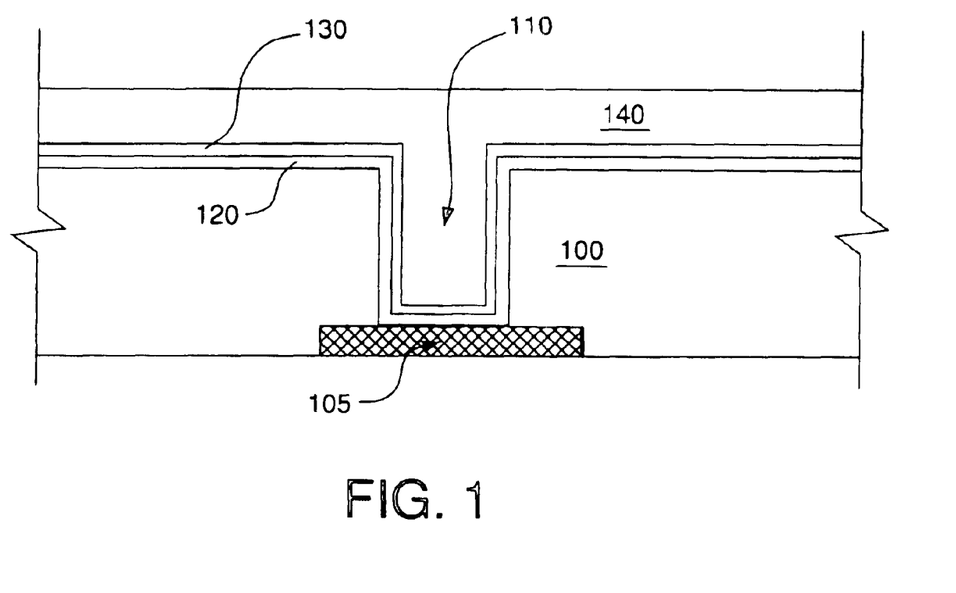
FIG. 1 provides a cross section view of a semiconductor substrate having a metal film prepared in accordance with the method of the present invention.

In certain preferred embodiments of the present invention, the process of the present invention may be used to prepare thin, conformal metal films or seed layers prior to the bulk deposition of the conductive metal used as the interconnect material. FIG. 1 provides a cross-section view of an exemplary semiconductor substrate that includes the metal film prepared in accordance with the present invention. As FIG. 1 illustrates, the semiconductor substrate 100 has a conductive layer 105 deposited from a previous metallization layer and material removed forming an in-laid region 110 to allow for the deposition of a conducting material. For purposes of the present invention, the term substrate may refer to any workpiece to which the metal film of the present invention may be applied as well as other material layers that may be formed on the surface of the workpiece. In the embodiment shown in FIG. 1, semiconductor substrate 100 further has a barrier layer 120, a metal film or seed layer 130 that is deposited onto barrier layer 120, and the bulk conductive material 140. Bulk conductive material 140 is depicted prior to CMP processing.

In certain preferred embodiments of the present invention, barrier layer 120 and metal film 130 are preferably deposited onto the substrate surface in an ALD process. The ALD process is typically conducted in a process tool such as, for example, the CVD reactor manufactured by Genus, Inc. of Sunnyvale, Calif. or the F-120 ALD reactor manufactured by ASM Microchemistry Inc. Further illustrations of suitable process tools for ALD processing may be found, for example, in FIG. 1 and related description of published U.S. Pat. App. 2002/0106846A1 and FIG. 4 and related description of U.S. Pat. No. 6,368,954. In these embodiments, the halogen-containing precursor and the metal-containing precursor are delivered sequentially to form the metal halide layer. In an alternative embodiment of the present invention, the metal halide layer may be grown in a non-ALD process, such as by a CVD process, by co-reacting the halogen-containing and metal-containing precursors on at least a portion of the substrate surface. In yet a further embodiment, the halogen-containing and metal-containing precursors can also be sequentially pulsed over a substrate to give a metal halide based film by an ALD or CVD type of reaction using super critical carbon dioxide as a carrier gas.

During a typical ALD process, one or more gaseous or vaporized precursors are introduced into the process chamber which houses the substrate in alternating pulses referred to herein as phases within a process cycle. Preferably, each process cycle forms no more than about one monolayer of material by adsorption and preferably by chemisorption. The number of process cycles used to grow the layer depends on the thickness desired but may generally exceed 1,000 cycles. For semiconductor devices, the process cycle is repeated until the barrier or seed layer within the dual damascene structure has a thickness sufficient to perform its desired function.

During ALD processing, the substrate is kept at a temperature range that facilitates chemisorption, i.e., is low enough to maintain intact bonds between adsorbed species and the underlying substrate yet high enough to avoid condensation of the precursors and to provide sufficient activation energy for the desired surface reactions in each process cycle. The process chamber temperature range may range from 0° C. to 400° C., preferably from 0° C. to 300° C., and more preferably from 0° C. to 275° C. The pressure within the process chamber during ALD processing may range from 0.1 to 1000 Torr, preferably from 0.1 to 15 Torr, and more preferably from 0.1 to 10 Torr. It is understood, however, that the temperature and pressure for any particular ALD process may vary depending upon the one or more precursors involved.

In certain preferred embodiments of the present invention, each pulse or phase of the process cycle is preferably self-limiting in effect. The term "self-limiting" as used herein describes when a surface becomes essentially non-reactive to the precursor within that phase after an adsorbed or chemisorbed monolayer is formed. The reactant precursors are preferably supplied in excess in each phase of the process cycle in order to substantially saturate the substrate surface to be deposited. In this manner, it is believed that surface saturation may provide reactant occupation of all available reactive sites while self-termination prevents excess film growth. These competing mechanisms of saturation and self-termination provide a uniform and conformal layer of material.

Figure 2A:
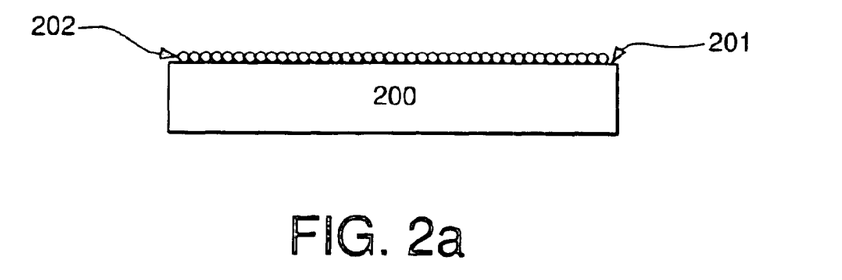
FIG. 2a provides a cross-sectional view taken of one embodiment of the process of the present invention during one step of the metal halide layer formation.
Figures 2B, 2C:
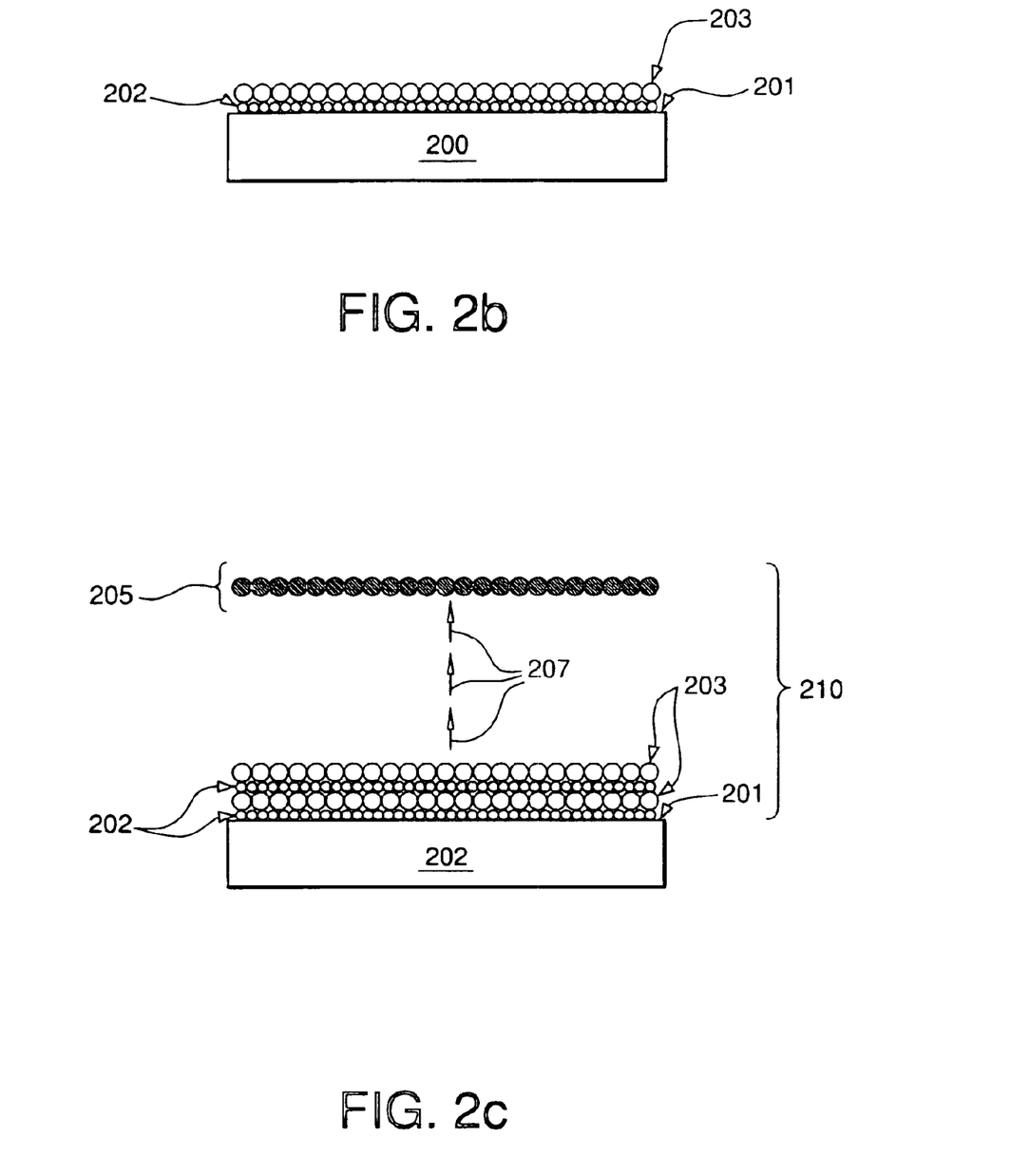
FIG. 2b provides a cross-sectional view taken of one embodiment of the process of the present invention during another step of the metal halide layer formation.
FIG. 2c provides a cross-sectional view taken of one embodiment of the process of the present invention during yet another step of the metal halide layer formation.

As mentioned previously, an ALD process may be used to grow barrier layers or metal films such as layers 120 and 130, respectively, in FIG. 1. The metal films of the present invention are formed from growing a metal halide layer from at least two precursors: a halogen-containing precursor and a metal-containing precursor. The resultant metal halide layer is then exposed to one or more reducing agents to form the metal film. FIGS. 2a–2c provides one embodiment of the process of the present invention that illustrates the various steps within the growth of the metal halide layer 210. In this manner, a series of monolayers are adsorbed, preferably chemisorbed, onto the substrate surface 201 by sequentially introducing a halogen-containing precursor and a metal-containing precursor into the process chamber.

FIG. 2a depicts a cross-sectional view of an exemplary portion of substrate 200 in a stage of integrated circuit fabrication, and more particularly, during one step of the growth of the metal halide layer. The metal halide layer may be formed by chemisorbing a halogen-containing precursor on at least a portion of the surface 201 of substrate 200 by introducing or pulsing the precursor into the process chamber. The precursor 202 preferably contains at least one halogen atom that may be attracted to the terminated surfaces left in previous production steps such as, for example, barrier layer formation, or the underlying substrate surface. While not being bound to theory, it is believed that the halogen-containing precursor forms a monolayer that can react with the subsequent pulse of metal-containing precursor to provide the metal halide layer and other volatile by-products.

Examples of suitable halogen-containing precursors include, but are not limited to, the following compounds: halogen-containing silanes; alkylchlorosilanes, alkylbromosilanes, or alkyliodosilanes; silicon halide compounds such as silicon tetrachloride, silicon tetrabromide, or silicon tetraiodide; halogenated tin compounds such as alkylchlorostannanes, alkylbromostannanes, or alkyliodostannanes; germane compounds such as alkylchlorogermanes, alkylbromogermanes, or alkyliodiogermanes; boron trihalide compounds such as borontrichloride, boron tribromide, or boron triodide; aluminum halide compounds such as aluminum chloride, aluminum bromide, or aluminum iodide; alkylaluminum halides; gallium halide compounds such as gallium trichloride, gallium tribromide, or gallium triodide; or combinations thereof. It is also envisioned that derivatives of the above compounds may also be used.

In certain preferred embodiments, the halogen-containing precursor comprises an acidic compound. Examples of these compounds include, but are not limited to, hydrohalic acids (e.g., hydrogen chloride (HCl), hydrogen bromide (HBr), hydrogen iodide (HI)) or fluorinated acids (e.g., trifluoroacetic acid or trifluoromethylsulfonic acid). The fluorinated acid compound may yield fluorinated copper compounds such as copper trifluormethylsulfonate which can subsequently be reduced to copper metal.

In embodiments wherein the halogen-containing precursor comprises an acidic compound, the acidic compound may protonate the substrate surface by releasing a $H^+$ ion thereby fostering the subsequent reaction between the metal atom in the metal-containing precursor and the protonated surface. For example, if the halogen-containing precursor comprises HCl and the metal-containing precursor comprises Cu(I)(hfac)(tmvs) wherein (hfac) is hexafluoroacetylacetone and (tmvs) is trimethylvinylsilane, it is believed that the HCl forms a monolayer and the incoming pulse of Cu(I)(hfac)(tmvs) reacts with the HCl of the monolayer to provide H(hfac), tmvs, and CuCl. While not being bound to theory, it is believed that the resulting CuCl layer may then be re-protonated by a subsequent pulse of HCl. In this manner, the relatively small halogen atoms of the halogen-containing precursor can form densely packed monolayers thereby providing more reactive sites with which the metal atoms of the metal-containing precursor can react. The foregoing factors—protonation of the underlying surface, densely packed, halide-containing monolayers, and more reactive sites—may result in a stronger chemisorption and more uniform deposition of the metal halide layer.

In a further embodiment of the present invention, the halogen-containing precursor may be non-acidic, i.e., does not protonate the underlying substrate surface. An example of this embodiment may be the use of an alkylchlorosilane such as trimethylchlorosilane ("$(CH_3)_3SiCl$") as the halogen-containing precursor. If the metal-containing precursor comprises Cu(I)(hfac)(tmvs), the reaction between $(CH_3)_3SiCl$ and Cu(I)(hfac)(tmvs) produces the products CuCl, tmvs, and $(CH_3)SiOC(CF_3)CHC(O)CF3$ wherein the latter product is the trimethylsilylenolether of hexafluoracetylacetone.

Depending upon the precursor selected, the halogen-containing precursor is introduced into the process chamber as a gas at a temperature that ranges from 0° to 450°, preferably from 0° to 350°, and more preferably from 25° to 200° C. The halogen-containing precursor may be combined with a carrier gas, such as but not limited to, helium (He), nitrogen ($N_2$), argon (Ar), or combinations thereof, to assist in transporting the precursor into the process chamber. In certain embodiments, the precursor may have a melting point above the process temperature. However, the gas may still be considered "volatile" in that it exhibits sufficient vapor pressure under process conditions to transport the species to the substrate in sufficient concentration to saturate the exposed surfaces. In yet other embodiments of the present invention, some of the above halogen-containing precursors can be dissolved into a suitable solvent and the vapor from the resulting solution may be transported either with or without a carrier gas into the process chamber. Suitable solvents include, but are not limited to, hydrocarbons (e.g. pentane or hexane); halocarbons; ethers (e.g. ethylether ($Et_2O$) or tetrahydrofuran ("THF")); nitrites (e.g. $CH_3CN$); or aromatic compounds (e.g. toluene).

After layer 202 of the halogen-containing precursor is chemisorbed onto the surface 201 of substrate 200, any excess of the precursor is removed from the process chamber via vacuum or other means. In certain embodiments, a pulse of purge gas, which may be comprised of the same gas as the carrier gas, may be supplied to the process chamber to further remove any residue from the halogen-containing precursor or reactant by-products from the process chamber or the substrate. The duration of the purge cycle may range from 0.1 to 1,000, preferably 0.1 to 60, and more preferably 0.1 to 2 seconds. The purge step may be conducted after each phase of the process cycle.

After the process chamber has been purged of the halogen-containing precursor, a pulse of the metal-containing precursor is introduced into the process chamber. Preferably, the metal-containing precursor comprises copper. Examples of suitable metal-containing precursors include the following: Cu(I)β-diketonate(L) wherein (L) is a stabilizing ligand such as an olefin, diene, silyl olefin, alkyne of silylalkyne, isonitrile, carbon monoxide, trialkyphospine; Cu(I)bis(β-diketonates); Cu(II)bis(β-diimines); Cu(I)β-diimine(L) where (L) is a stabilizing ligand such as an olefin, silyl olefin, alkyne of silylalkyne, dienes, isonitrile, carbon monoxide, trialkyphospine; Cu(I) alkoxides; Cu(I) amides; Cu(II)β-ketoimines; Cu(I)β-ketoimine(L) where (L) is a stabilizing ligand such as an olefin, silyl olefin, alkyne of silylalkyne, dienes, isonitrile, carbon monoxide, trialkyphospine; Cu(II)bis(alkoxyamines); Cu(I) alkyls; Cu(I) aryls; or Cu(I)phenoxides.

In certain preferred embodiments, the metal-containing precursor may be at least one compound represented by the following structure:

wherein M and M' are each a metal such as Cu, Ag, Au, Os, or Ir; X and X' are each N or O; and Y and Y' are each Si, C, Sn, Ge, B, or Al; Z and Z' are each C, N, or O; R1, R2, R1', and R2' can be any combination of alkyl, alkynyl, alkenyl, partially fluorinated alkyl aryl, alkyl-substituted aryl, partially fluorinated aryl, fluoroalkyl-substituted aryl, trialkylsilyl, or triarylsilyl; R3, R4, R3', and R4' can be any combination of hydrogen, alkyl, partially fluorinated alkyl, trialkylsilyl, triarylsilyl, trialkylsiloxy, triarylsiloxy, aryl, alkyl-substituted aryl, partially fluorinated aryl, fluoroalkyl-substituted aryl, or an alkoxy; and R5, R6, R5', and R6' can be any combination of hydrogen, alkenyl, alkynyl, alkyl, partially fluorinated alkyl, aryl, alkyl-substituted aryl, partially fluorinated aryl, fluoroalkyl-substituted aryl, trialkylsilyl, triarylsilyl, trialkylsiloxy, triarylsiloxy, an alkoxy, a SiR7R8N(R9R10) group, or a SiR7R8OR11 group wherein R7, R8, R9, R10, and R11 can be an alkyl. In all of the substitutions, alkyl and alkoxy can have 1 to 8 carbons, alkenyl and alkynyl can each have 2 to 8 carbons, and aryl can have 6 carbons. In embodiments where X and X'=O, the formula only bears the substituents R1 and R1' as described above. In embodiments where Z and Z'=O, there are no substituents R5, R6, R5', and R6'. In embodiments where Z and Z'=N, there are no substituents R6 and R6'. In any embodiment where elements X/X'; Y/Y'; and/or Z/Z' have substituent pair R1/R2 and pair R1'/R2'; pair R3/R4 and pair R3'/R4', and/or pair R5/R6 and pair R5'/R6', respectively, the components comprising such a pair can connect together independently to form a ring structure. Further, the components comprising substituent pair R7 and R8 and pair R9 and R10 can also link together to form a ring structure. For example, in embodiments wherein X and X' is N, the pair components R1 and R2 can link together to form a ring structure as can the pair components R1' and R2'. Further examples of the metal-containing precursors, along with methods for manufacturing same, are provided in published U.S. Pat. Application 2002/0013487 and in pending application U.S. Ser. No. 10,323,480, which is assigned to the assignee of the present invention and incorporated herein by reference in its entirety.

Depending upon the precursor selected, the metal-containing precursor is introduced into the process chamber as a gas at a temperature that ranges from 0° to 450°, preferably from 0° to 350°, and more preferably from 15° to 200° C. Like the halogen-containing precursor, the gaseous or vaporized form of the metal-containing precursor may be combined with a carrier gas such as any of the carrier gases disclosed herein. The metal-containing precursor should have sufficient volatility to deliver a vapor to the process chamber at processing temperatures in an amount capable of achieving a monolayer of coverage on the targeted substrate. Further, the metal-containing precursor may be a solid that is at least partially dissolved in a solvent such as any of the solvents disclosed herein to provide a metal-containing vapor that is delivered to the process chamber by vaporization of the resulting solution.

Referring to FIG. 2b, a layer 203 of metal from the metal-containing precursor is illustratively shown as chemisorbed on halogen layer 202 at least in part in response to introduction of the metal-containing precursor. While not wishing to be bound by theory, it is believed that the metal layer 203 was formed in a similar self-limiting manner as was halogen layer 202. Referring now to FIG. 2c, each metal layer 203 and halogen layer 202 in any combination and in direct contact with one another form a metal halide sublayer 205 in each process cycle, whether or not either, both, or neither of the metal layer and halogen layer is a monolayer. Metal halide sublayer 205 is the product of the chemical reaction between the halogen layer 202 and the metal layer 205.

After the metal-containing precursor is chemisorbed onto halogen layer 202 on substrate 200 to form metal containing layer 203, excess of the metal-containing precursor gas and reaction by-products may be removed from the process chamber by a vacuum or similar means. As with the halogen-containing precursor, a pulse of purge gas may be supplied to the process chamber to facilitate this removal.

Referring again to FIG. 2c, a number of process cycles, wherein metal halide sublayers 205 are grown and are represented as arrows 207, are conducted until the desired layer of metal halide 210 of sufficient thickness is achieved. Metal halide layer 210 may, for example, have a thickness that ranges from 0.5 to 10,000 preferably ranges from 1 to about 100, and more preferably ranges from 1 to 20 Angstroms.

In FIGS. 2a–2c, metal halide layer 210 growth is depicted as starting with chemisorption of a halogen-containing compound on substrate 200 followed by chemisorption of a metal-containing compound. Alternatively, metal halide layer 210 formation may begin with chemisorption of a metal-containing compound on substrate 200 followed by chemisorption of a halogen-containing compound. The order of chemisorption may vary depending upon the surface and phase chemistries of the underlying substrate.

In certain embodiments of the present invention, the substrate surface has a barrier layer to which the metal halide layer is deposited thereupon. Since the barriers materials also need to be grown very thin with high conformality, these layers are also preferably grown by ALD. Typically, the barrier layer may be formed using tantalum (Ta). Suitable compounds used to form the barrier layer may also include, but are not limited, to compounds comprised substantially of the following: titanium nitride such as TiN, tungsten nitride such as WN, tungsten carbon nitride such as WCN, tantalum nitride such as TaN, tantalum (Ta), silicide compounds comprised of the foregoing (e.g. TiSiN, WSiN, or TaSiN), or mixtures and derivatives thereof. Tungsten nitride barrier layers may be formed using the following precursors: $WF_6$ and $NH_3$ or $W(CO)_3$ and $NH_3$. Tantalum nitride barrier layers may be formed using $TaCl_5$ and $NH_3$ as precursors. Published U.S. Pat. Application No. 2002/0106846 provides an example of the formation of a tantalum nitride barrier layer.

In certain preferred embodiments, the ALD process for barrier layer formation is performed prior to the ALD process for the seed layer formation. In certain preferred embodiments, the final monolayer of the barrier layer formation may be terminated with, for example, a nitrogen species for TaN barrier layers, to foster interfacial bonding between the barrier layer and the seed layer. In embodiments having a TaN barrier layer, the final monolayer may include surface groups such as the following: Ta—$NH_2$, Ta=NH, or Ta=N—Ta. These surface groups may be highly suitable to receive from the halogen-containing precursor, for example, an acid species such as HCl as a free gas or from a quaternary ammonium species such as $[R_3NH]^+[C]^-$. The reaction between the nitrogen species of the barrier layer and the acid species of the halogen-containing precursor may provide surface species such as $[Ta=NH_2]^+[Cl]^-$ or $[Ta—NH_3]^+[Cl]^-$. Similarly, analogous TaN surface species could be prepared through ALD or through CVD TaN by nitriding tantalum metal and then treating the nitrided tantulum metal with a halogen-containing acid species such as HCl. Other metal and nitrogen containing barrier layers such as WCN could be also protonated through exposure to the halogen-containing acid species. The protonated monolayers may then be contacted with a suitable metal-containing precursor, preferably copper-containing precursor, and then contacted with the halogen-containing acid species. In this manner, a series of process cycles as outlined herein can be repeated to form the metal halide layer. The halide may be removed via a reducing agent either prior to and or after the completion of the growth of the metal halide layer. Once all the halide is removed, the copper comes into intimate contact with the underlying tantalum nitride barrier layer and thereby high adhesive strength is achieved. Additionally, while not wishing to be bound by theory, this approach may allow for the use of fluorinated copper precursors which are normally known to yield poorly adhering films due to the breakdown of the fluorinated ligands at the tantalum interface with copper.

As mentioned previously, after the metal halide layer is grown, the metal halide layer is exposed to a reducing agent to form the metal film or seed layer. The step of exposing the metal halide layer to a reducing agent may occur either prior to or after the completion of the metal halide layer. This step may be performed intermittently, i.e., after one or more process cycles are conducted, rather than the completion of the growth of the entire metal halide layer. In these embodiments, a number of monolayers of a metal halide such as copper halide is reduced to copper metal prior to the completion of the growth of the metal halide layer. The reducing agent is typically exposed to the metal halide layer in gaseous form. In these embodiments, the temperature in which the step is conducted ranges from 0° C. to 400° C., preferably 25° C. to 200° C., and more preferably 25° C. to 100° C. and at a pressure which ranges from 0.1 to 1000, preferable 0.1 to 100, and more preferably 0.1 to 10 Torr. In a further embodiment, the metal halide layer may be exposed to a liquid containing a suitable reducing agent to provide the metal film. Examples of suitable reducing agents include, but are not limited to, hydrogen gas, remote hydrogen plasma, silanes, boranes, alanes, germanes, hydrazines, or mixtures thereof.

In certain preferred embodiments, the metal halide layer may be reduced by a silane. It is believed that the reduction of the metal halide layer by silane may improve the removal of the halide from the metal halide layer. For example, the reaction of copper chloride with diethylsilane produces copper metal and the compound diethylchlorosilane. Thus, the halide may be more effectively removed from the copper film because it forms a covalent bond to silicon. This may provide an improved method of halide removal from a metal containing film than is typically seen in CVD or ALD processes using metal halides to form metal containing films. By way of comparison, titanium nitride can be formed in an ALD or CVD process between titanium chloride and ammonia gas whereby the released chloride exits the film as ammonium chloride. The latter species represents halide bound to an ammonium ion as a volatile salt that can readily dissociate back to ammonia and HCl thus limiting the effectiveness of the ammonium salt as a vehicle to remove chloride from the metal containing film.

The method of the present invention may also be used in the formation of mixed metal alloy thin films by ALD such as a copper alloy film. More than one metal may be incorporated into the ALD grown film to enhance the performance attributes of the metal film such as electromigration resistance. For copper films, one or more metals, such as, but not limited to, Ag, Au, Os, Ir, Pt, Pd, Re, Rh, Ni, Co, or Ru, may be used as alloying metals. In these embodiments, layers of a metal halide may be grown by ALD followed by additional layers of at least one more metal, or alloy metal-containing layer, that differs from the metal in the first layer. After the growth step is complete, the first metal halide and alloy metal halide are reduced to form a metal alloy film. The ratio of the first metal halide layer to the alloy metal halide layer determines the composition of the final metal alloy after reduction. The alloy metal-containing halide layer may be grown prior to or after the completion of the first metal halide layer. For example, the ALD copper halide growth is temporarily halted and a fresh layer of a different metal halide is deposited using an analogous ALD or CVD technique. The copper halide ALD can then be recommenced. The resulting sandwich structure of alternating metal halides can then be chemically reduced to form a metal alloy.

The invention will be illustrated in more detail with reference to the following examples, but it should be understood that the present invention is not deemed to be limited thereto. In the following examples, elemental analysis was performed on a Perkin Elmer 2400 series analyzer. XRD measurements were obtained on a Siemens/Bruker D5000 spectrometer used in Immediate Mode from 10–75° with parallel beam optics, a ceramic X-ray tube, 2200 watt at long fine focus and a 0.02° step size and 2.0 sec count time. EDX analysis was performed on a Hitachi S-750 Scanning Electron Microscope. The G.C.M.S. Spectra for the examples were performed on a Hewlett Packard 5890 Series 11 G.C. and 5972 series mass selective detector with a HP-5MS.

EXAMPLES

Example 1

Treating Cu(I)(hfac)(tmvs) Dissolved in Tetrahydrofuran with Hydrogen Chloride

A 23.2 gram quantity of Cu(I)(hfac)(tmvs) commercially available as CupraSelect® by Schumacher, Inc., a division of the assignee of the present invention, was dissolved in an approximately 250 milliliter quantity of the solvent tertahydrofuran (THF) while stirring under an nitrogen atmosphere to provide a solvent. A one mole equivalent of hydrogen chloride (HCl) (2.0 M in diethyl ether) was slowly added to the solution while stirring at room temperature. The addition of HCl resulted in the instantaneous precipitation of a white copper chloride powder sample, 3.67 gram and 58% of theoretical. The sample was filtered and pumped dry. The entire process was then repeated to yield a total of two samples of copper chloride.

Elemental analysis of both samples indicated that the first sample contained 0.0 weight % carbon and 0.0 weight % hydrogen and the second sample contained 0.14 weight % carbon and 0.05 weight % hydrogen. XRD measurements of the second sample showed that it contained pure copper chloride. The second sample was treated with an excess quantity of diethylsilane overnight at room temperature to provide a coppery precipitate. Elemental analysis of the coppery precipitate indicated that the precipitate contained 0.08 weight % carbon and 0.0 weight % hydrogen. XRD measurements of the copper precipitate showed that it was essentially pure copper.

Independent reactions between copper chloride and diethylsilane under the same conditions as in the reduction of the copper chloride samples prepared above showed the formation of diethylchlorosilane, as identified by GCMS, along with a copper precipitate.

Example 1 is a solution-based model that illustrates that a copper-containing precursor such as Cu(I)(hfac)(tmvs) and a chloride-containing precursor such as HCl will react to form a copper chloride species which in turn can be reduced by a reducing agent such as diethylsilane to form a copper metal. It is anticipated that the copper based solid may not be entirely pure because it is precipitated out of solution as an insoluble inorganic salts and metals. Thus, the copper solid may contain traces of unreacted organic ligands. In the corresponding ALD experiment, or example 3, it is anticipated that the monolayer by monolayer chemical reactions are more likely to reach completion thereby achieving films of higher purity.

Example 2

Treating [—CuNMe$_2$SiMe$_2$CH$_2$CuNMe$_2$SiMe$_2$CH$_2$—] Dissolved in THF with HCl A 6.9 gram quantity of [—CuNMe$_2$SiMe$_2$CH$_2$CuNMe$_2$SiMe$_2$CH$_2$—], which was prepared in accordance with one of the methods disclosed in published U.S. Pat. Application 2002/0013487, was dissolved in an approximately 100 milliliter quantity of THF while stirring under a nitrogen atmosphere to provide a reaction mixture. A two molar equivalent amount of HCl (2.0 M in diethylether) was added to the reaction mixture at room temperature with stirring. The resulting reaction yielded a copper chloride precipitate sample, 3.02 gram and 78% of theoretical. The sample was filtered off and pumped dry.

Elemental analysis of the sample indicated that it contained 1.8 weight % carbon, 0.00 weight % hydrogen, and 0.91 weight % nitrogen. XRD measurements of the sample found it to contain pure copper chloride.

The sample was then treated with an excess quantity of diethylsilane at room temperature overnight to yield a copper colored solid. Elemental analysis of the copper colored solid indicated that it contained 1.54 weight % carbon, 0.00 weight % hydrogen and 0.75 weight % nitrogen. XRD measurements of the copper colored solid showed it to contain pure copper.

Example 2 is a solution-based model that illustrates that a copper-containing precursor [—CuNMe$_2$SiMe$_2$CH$_2$CuNMe$_2$SiMe$_2$CH$_2$—] and a chloride-containing precursor HCl will react to form a copper chloride which can treated with a reducing agent such as diethylsilane to form a copper metal.

Example 3

ALD Preparation of Cu Films by Growing CuCl Film Using Cu(I)(hfac)(tmvs) and Hydrogen Chloride Followed by Diethylsilane Reduction A 3"×0.5" silicon wafer coated with a 200 Angstrom thick diffusion layer of TiN is placed into the chamber of ALD reactor comprised of a chamber fitted with a three-way mixing valve to permit the sequential purging of the chamber with halogen-containing precursor, nitrogen, and metal-containing precursor at atmospheric pressure. The wafer is held at a temperature of 25° C. A copper precursor, Cu(I)(hfac)(tmvs), is cooled to a temperature of 15° C. under a nitrogen atmosphere. Vapor from the copper precursor is introduced into the chamber at atmospheric pressure for a duration of 2 seconds and a flow rate of approximately 1800 standard cubic centimeters per minute (sccm). The chamber is then flushed with nitrogen gas for approximately 50 seconds at a flow rate of 1800 sccm to remove any residual Cu(I)(hfac)(tmvs) vapor. Vapor from a 0.5 M solution of anhydrous HCl in tetrahydrofuran solvent is then introduced into the chamber at 1800 sccm for a duration of 1 second. The chamber is flushed with nitrogen gas for approximately 50 seconds pulse to remove any residual HCl vapor. The copper precursor vapor is then pulsed in for two seconds and the process is repeated for about 250 cycles until an approximately 20 to 30 nanometer film is formed.

EDX analysis of the film showed that the film was comprised of only the elements chlorine and copper or comprised copper chloride. Exposure of the film to diethylsilane vapor at room temperature and under atmospheric pressure caused the film to undergo a color change. An EDX analysis of the film after exposure to the diethysilane vapor indicated that no chlorine was present or the film was reduced to copper metal.

As example 1 has established via solution modeling, the copper-containing precursor Cu(I)(hfac)(tmvs) will react with the halogen-containing precursor HCl to provide a CuCl film. The CuCl film was then reduced via the reducing agent diethylsilane to form a copper film.

While the invention has been described in detail and with reference to specific examples thereof, it will be apparent to one skilled in the art that various changes and modifications can be made therein without departing from the spirit and scope thereof.

What is claimed is:

1. A method of depositing a metal layer on a semiconductor substrate surface, the method comprising:
   growing a metal halide layer from a halogen-containing precursor and a metal-containing precursor on at least a portion of the surface; and
   exposing the metal halide layer to a reducing agent to provide the metal layer.

2. The method of claim 1 wherein the growing step comprises:
   chemisorbing the halogen-containing precursor on at least a portion of the surface; and
   chemisorbing the metal-containing precursor on at least a portion of the surface wherein the metal and the halogen within the precursors react to form the metal halide layer.

3. The method of claim 1 wherein the halogen-containing precursor and the metal-containing precursor are delivered sequentially to form the metal halide layer.

4. The method of claim 1 wherein the halogen-containing precursor and the metal-containing precursor are co-reacted to form the metal halide layer.

5. The method of claim 1 wherein the halogen-containing precursor is at least one from the group consisting of halogen-containing acids, halogen-containing silanes, alkylchlorosilanes, alkylbromosilanes, alkyliodosilanes, silicon halide compounds, halogenated tin compounds, germane compounds, boron trihalide compounds, alkylaluminum halide compounds, aluminum halide compounds, gallium halide compounds, or combinations thereof.

6. The method of claim 5 wherein the halogen-containing precursor is a halogen-containing acid.

7. The method of claim 6 wherein the halogen-containing precursor is HCl.

8. The method of claim 1 wherein the metal-containing precursor comprises copper.

9. The method of claim 8 wherein the metal-containing precursor is at least one from the group consisting of Cu(I) β-diketonate (L) wherein (L) is stabilizing ligand such as an olefin, diene, silyl olefin, alkyne of silylalkyne, isonitrile, carbon monoxide, trialkyphospine; Cu(II)bis(β-diketonates); Cu(II)bis(β-diimines); Cu(I)β-diimine (L) where (L) is a stabilizing ligand such as an olefin, silyl olefin, alkyne of silylalkyne, dienes, isonitrile, carbon monoxide, trialkyphospine; Cu(I) alkoxides; Cu(I) amides; Cu(II) β-ketoimines; Cu(I)β-ketoimine(L) where (L) is a stabilizing ligand such as an olefin, silyl olefin, alkyne of silylalkyne, dienes, isonitrile, carbon monoxide, trialkyphospine; Cu(II) bis(alkoxyamines); Cu(I) alkyls; Cu(I) aryls; or Cu(I) phenoxides.

10. The method of claim 1 wherein the metal-containing precursor comprises at least one compound represented by the structure:

wherein M and M' are each Cu, Ag, Au, Os, or Ir;
   X and X' are each N or O;
   Y and Y' are each Si, C, Sn, Ge, B, or Al;

Z and Z' are each C, N, or O;

R1, R2, R1', and R2' are each independently an alkyl, an alkenyl, an alkynyl, a partially fluorinated alkyl, an aryl, an alkyl-substituted aryl, a partially, fluorinated aryl, fluoralkyl-substituted aryl, a trialkylsilyl, or a triarylsilyl when X and X' are N;

R1 and R1' are each independently an alkyl, an alkenyl, are alkynyl, a partially fluorinated alkyl, an aryl, an alkyl-substituted aryl, a partially fluorinated aryl, a fluoralkyl-substituted aryl, a trialkylsilyl, or a triarylsilyl when X and X' are O;

R3, R4, R3', and R4' are each independently a hydrogen, an alkyl, a partially fluorinated alkyl, a trialkylsilyl, a triarylsilyl, a trialkylsiloxy, a triarylsiloxy, an aryl, an alkyl-substituted aryl, a partially fluorinated aryl, a fluoroalkyl-substituted aryl, or an alkoxy; and R5, R6, R5', and R6' are each independently a hydrogen, an alkyl, an alkenyl, an alkynyl, a partially fluorinated alkyl, an aryl, an alkyl-substituted aryl, partially fluorinated aryl, a fluoralkyl-substituted aryl, a trialkylsiloxy, a triarylsiloxy, a trialkylsilyl, a triarylsilyl, or an alkoxy, a SiR7R8N(R9R10) group, or a SiR7R8OR11 group where R7, R8, R9, R10, and R11 can be an alkyl;

provided that when X and X' are each O, there is no substitution at R2 and R2';

further provided that when Z and Z' are each N, there is no substitution at R6 and R6';

further provided that when Z and Z' are each O, there is no substitution at R5, R6, R5', or R6';

said alkyl and alkoxide having 1 to 8 carbons; said alkenyl and alkynyl having 2 to 8 carbons;

and said aryl having 6 carbons.

11. The method of claim 1 wherein the semiconductor substrate has a barrier layer to which the metal halide layer is grown thereupon.

12. The method of claim 11 wherein the barrier layer is at least one selected from the group consisting of titanium nitride compounds, titanium compounds, tantalum nitride compounds, tungsten carbon nitride compounds, tantalum compounds, silicide compounds of the foregoing, or mixtures thereof.

13. The method of claim 1 wherein the reducing agent is at least one from the group consisting of hydrogen, silanes, boranes, alanes, germanes, hydrazines, or mixtures thereof.

14. The method of claim 13 wherein the reducing agent is a silane.

15. The method of claim 14 wherein the reducing agent is diethylsilane.

16. The method of claim 1 wherein the exposing step is conducted prior to the completion of the growing step.

17. The method of claim 1 wherein the exposing step is conducted after the completion of the growing step.

18. A method for forming a metal layer on a surface of a substrate, the method comprising:

growing a metal halide layer on the surface by contacting the surface with a halogen-containing precursor and a metal-containing precursor wherein the halogen and the metal within the precursors react to form the metal halide layer; and exposing the metal halide layer to a reducing agent to provide the metal layer.

19. The method of claim 18 further comprising forming an alloy metal halide layer from an alloy metal-containing precursor wherein the metal in the alloy metal-containing precursor is different from the metal of the metal-containing precursor.

20. The method of claim 19 wherein the alloy metal-containing precursor is at least one from the group consisting of Ag, Au, Os, Ir, Pt, Pd, Rh, Re, Ni, Co, Ru, or combinations thereof.

21. The method of claim 19 wherein the forming step is conducted prior to the exposing step.

22. The method of claim 18 wherein the exposing step occurs prior to the completion of the growing step.

23. The method of claim 18 wherein the exposing step occurs after the completion of the growing step.

24. A method of depositing a metal layer on semiconductor substrate surface, the method comprising:

growing a metal halide layer from a halogen-containing precursor comprising an acid and a metal-containing precursor on at a least a portion of the surface wherein the semiconductor substrate has a barrier layer to which the metal halide layer is grown thereupon; and exposing the metal halide layer to a reducing agent to provide the metal layer.

25. The method of claim 24 wherein the acid is at least one selected from the group consisting of hydrohalic acids or fluorinated acids.

26. The method of claim 24 wherein the barrier layer is at least one compound selected from the group consisting of titanium nitride compounds, titanium compounds, tantalum nitride compounds, tungsten carbon nitride compounds, tantalum compounds, silicide compounds of the foregoing or mixtures thereof.

27. A method of depositing a metal layer on at least a portion of a substrate surface, comprising: alternately introducing vapor phase pulses of a halogen-containing precursor and a metal-containing precursor into a reaction chamber having the substrate contained therein to provide a metal halide layer and exposing the metal halide layer to a reducing agent to provide the metal layer.

28. A method of depositing a metal layer on a surface of an article, the method comprising:

growing a metal halide layer on at least a portion of the surface from plurality of precursors comprising: a halogen-containing precursor and a metal-containing precursor wherein the halogen-containing precursor is substantially free of metal or contains metal that differs from that in the metal layer; and exposing the metal halide layer to a reducing agent to provide the metal layer.

29. The method of claim 28 wherein the plurality of precursors within the growing step further comprises an alloy metal-containing precursor.

30. A method for forming a metal layer comprising at least one metal on a surface of an article, the method comprising:

growing a metal halide layer on the surface by contacting the surface with a halogen-containing precursor, a metal-containing precursor, and optionally an alloy metal-containing precursor wherein the halogen, the metal, and optionally the alloy metal within the precursors react to form the metal halide layer and wherein the halogen-containing precursor is substantially free of metal or contains metal that differs from that in the metal layer; and exposing the metal halide layer to a reducing agent to provide the metal layer.

* * * * *